United States Patent [19]
Matsuoka

[11] Patent Number: 5,282,750
[45] Date of Patent: Feb. 1, 1994

[54] ELECTRIC CONTACTOR UNIT

[75] Inventor: Noriyuki Matsuoka, Yokohama, Japan

[73] Assignee: Yamaichi Electronics Co., Ltd., Tokyo, Japan

[21] Appl. No.: 974,126

[22] Filed: Nov. 10, 1992

[30] Foreign Application Priority Data

Nov. 25, 1991 [JP] Japan .................. 3-336246

[51] Int. Cl.5 .................. H01R 9/09; H01R 13/405
[52] U.S. Cl. .................. 439/72; 29/883
[58] Field of Search ............... 29/874, 883, 884; 439/70, 71, 72, 736, 862, 886

[56] References Cited

U.S. PATENT DOCUMENTS

| | | | |
|---|---|---|---|
| 4,269,467 | 5/1981 | Hughes | 29/883 X |
| 4,491,378 | 1/1985 | Crawford | 439/71 X |
| 4,623,208 | 11/1986 | Kerul et al. | 439/71 X |
| 4,679,871 | 7/1987 | Egawa | 439/72 X |
| 4,824,389 | 4/1989 | Doyle et al. | 439/72 X |
| 5,017,154 | 5/1991 | Matsuoka | 439/886 X |

FOREIGN PATENT DOCUMENTS 62-170177  7/1987  Japan .
64-3977    1/1989  Japan .

*Primary Examiner*—Peter Dungba Vo
*Attorney, Agent, or Firm*—Wenderoth, Lind & Ponack

[57] ABSTRACT

Insulating sheets 7 are interposed between adjacent electric contactors 1, and the electric contactors 1 group are integrally formed by being covered with an insulating block 6. A contact portion 2a of each electric contactor 1 is exposed from the insulating block 6.

4 Claims, 5 Drawing Sheets

ELECTRIC CONTACTOR UNIT

BACKGROUND OF THE INVENTION

1. Field of the Invention

This invention relates to an electric contactor unit comprising a plurality of electric contactors integrated by an insulating material.

2. Brief Description of the Prior Art

As a conventional contact of this type, there is known a terminal assembly as shown in Japanese Patent Early Laid-Open Publication No. Sho 62-170177, which comprises a plurality of terminals and insulating sheets such as rubber sheets interposed between the terminals. With respect to other prior art, Japanese Patent Early Laid-Open Publication No. Sho 64-3977 discloses a connector for an electric part which comprises a plurality of electric connectors and insulating films applied onto the surfaces of the electric connectors, respectively, the electric connectors being mounted in a connector base formed of an insulating material in such a manner as to intimately engage the insulating films to each other.

In Japanese Patent Early Laid-Open Publication No. Sho 62-170177, however, since the insulating material is disposed at adjacent opposing surfaces of the electric contactors, when foreign matter such as metal screws contact the contactors, there is an inconvenience that there is insufficient insulation. In the case of Japanese Patent Early Laid-Open Publication No. Sho 64-3977, since the electric contactors are separated much time and labor are required for mounting them individually.

Referring back to Japanese Patent Early Laid-Open Publication No. Sho 62-170177, the electric contactors and the elastic insulating sheets interposed therebetween are required to be formed into predetermined shapes beforehand. On the other hand, Japanese Patent Early Laid-Open Publication No. Sho 64-3977 has an additional problem that when spaces between the adjacent electric contactors are different, the thickness of the insulating film is required to be changed in accordance with the different size spaces.

The present invention has been made in order to solve the above problems inherent in the prior art.

SUMMARY OF THE INVENTION

It is therefore an object of the present invention to provide an electric contactor unit capable of effectively coping with the requirement for mounting electric contactors in very tiny intervals in a connector.

Another object of the present invention is to provide an electric contactor unit which can be easily mounted on a connector base.

A further object of the present invention is to provide an electric contactor unit capable of effectively preventing an occurrence of a short-circuit between contactors caused by a foreign matter interposed therebetween.

To achieve the above objects, there is essentially provided an electric contactor unit comprising a plurality of electric contactors, and insulating sheets interposed between the electric contactors respectively, a group of the electric contactors being integrally formed into a block from an insulating material, at least a contact portion of each of the electric connectors being exposed from the block. Three or more end portions of each of the electric contactors may be exposed from the block.

As described above, according to the present invention, the insulating sheets are interposed between the electric contactors respectively, and they are integrally formed into a block from an insulating material. Accordingly, the electric contactor unit of the present invention can effectively cope with the requirement for implanting the electric contactors at very small pitches. Even if the injection molding pressure is applied to the electric contactors, there is no fear that the electric contactors will short-circuited with each other within the electric contactor unit because the insulating sheets are interposed between the adjacent electric contactors. As a result, formation of the electric contactors, etc. into a block can be properly effected while satisfying the requirement for arranging the electric contactors at very small pitches.

Furthermore, even if a foreign matter such as metal screw happens to contact the electric contactor, insufficient insulation is not easily caused. Since the electric contactors can be easily mounted on the connector base utilizing the insulating block, much time and labor for mounting the electric contactors as compared to mounting them individually can be saved.

Moreover, by positioning the electric contactors in a resin shaping mold and injection-molding the same with an insulating material, the insulating block can be formed into a shape required in a socket. Therefore, the trouble of changing the thickness of insulating film in accordance with the spaces between the adjacent electric contactors as in the prior art can be eliminated.

DETAILED DESCRIPTION OF THE EMBODIMENTS

The present invention will now be described in detail with reference to FIGS. 1 through 9 inclusive.

Figure 3:
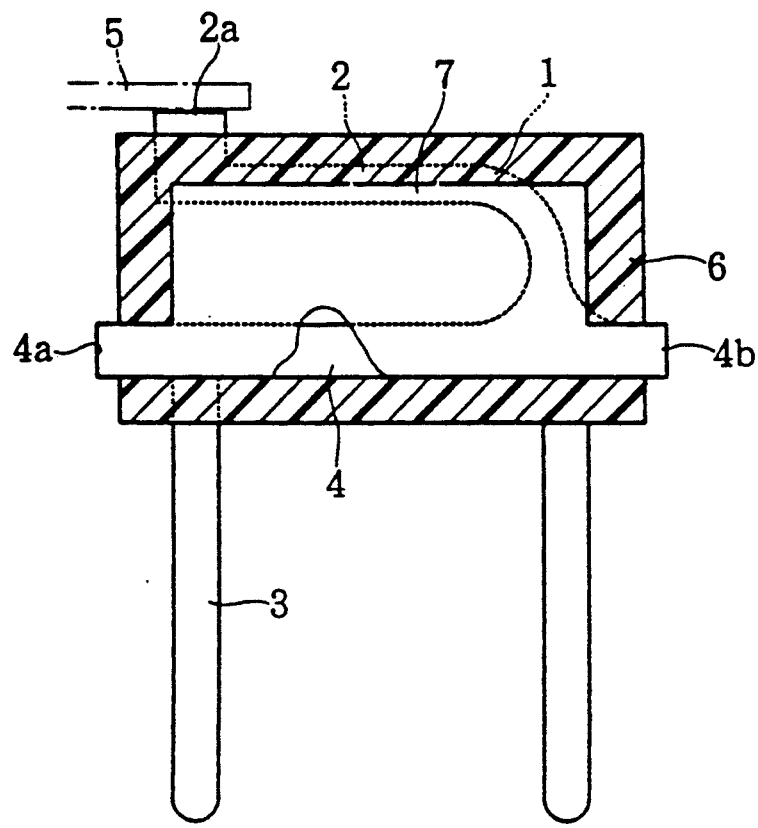
FIG. 3 is a sectional elevation view of the unit of FIG. 1.

Each of electric contactors 1, as shown in FIG. 3 and others, is provided at an upper portion thereof with an elastic contact element 2 and at a lower portion thereof with a terminal 3. The elastic contact element 2 and the terminal 3 are connected with each other through a seat element 4 extending in a lateral direction. The three component elements 2, 3 and 4 are integrally formed, for example by being punched out of an electrically conductive sheet material. The elastic contact element 2 extends from a rear end of the seat element 4 toward a front end thereof above the seat element 4, and has an upwardly projecting contact portion 2a formed on a front end of the elastic contact element 2. By urging an electric part terminal 5 such as an IC lead against the contact portion 2a after the electric part terminal 5 is placed on the contact portion 2a, the elastic contact element 2 is flexed downward, and contact pressure with the terminal 5 is obtained by the reaction of the contactor 1.

The terminal 3 extends downward from a front or rear end of the seat element 4 so as to contact, for example, a wiring board. This terminal 3 may take the form of a male terminal, a female terminal, or the like as necessary.

Figure 1:
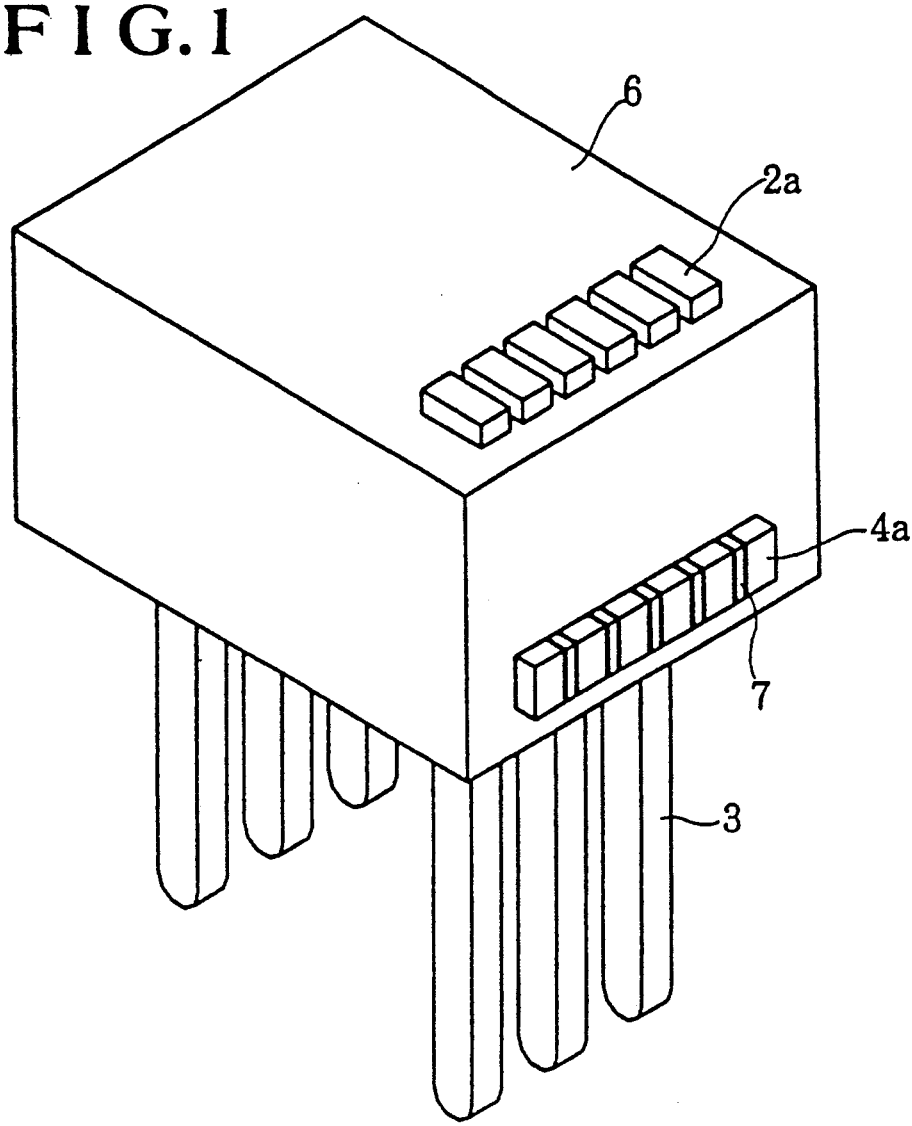
FIG. 1 is a perspective view of an electric contactor unit according to one embodiment of the present invention.
Figure 2:
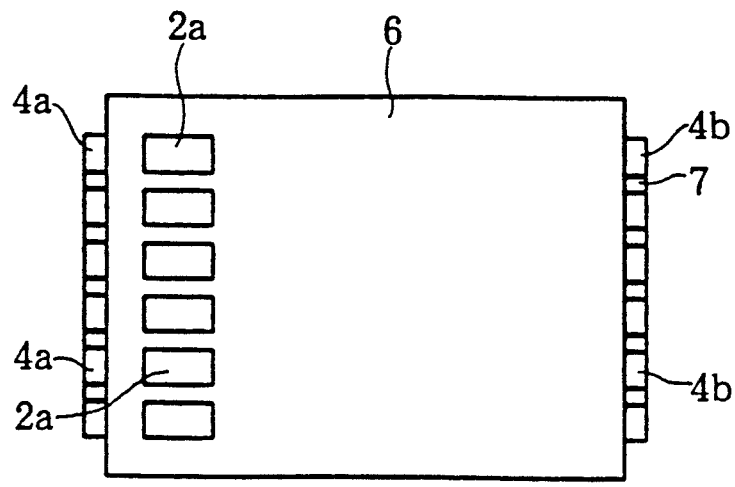
FIG. 2 is a plan view of the unit of FIG. 1.

A plurality of electric contactors 1 of the type described are arranged in a side-by-side array, and insulating sheets 7 are interposed between adjacent electric contactors. The whole array of the electric contactors 1 is integrally formed into an insulating block 6 as shown in FIGS. 1 and 2, and a group of the electric contactors 1 are thus unitized by the insulating block 6. Preferably, the insulating block 6 is formed of insulating material having an abundant elasticity.

The insulating sheets 7 electrically isolate the adjacent electric contactors 1 and ensure minimum spaces between the electric contactors 1. In addition, they prevent a minor sideways motion within the insulating block 6, and particularly an excessive sideways motion caused by resin fluid pressure at the time when the insulating block is injection molded, thereby serving as means for preventing an occurrence of a short-circuit between the adjacent contactors.

Figure 4:
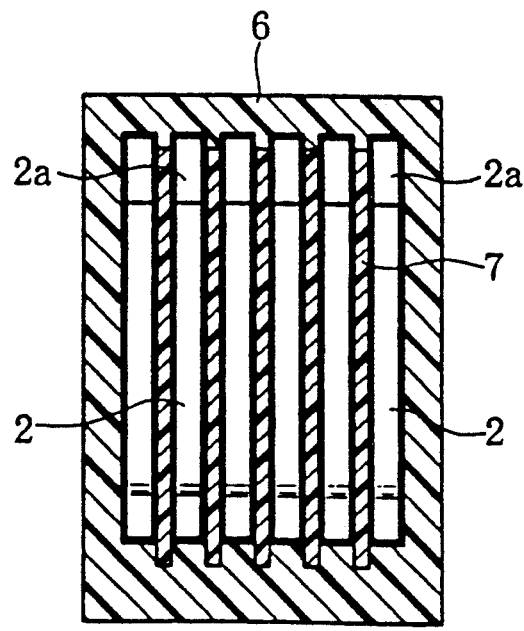
FIG. 4 is a horizontal sectional view of the unit of FIG. 1.

As shown in FIGS. 3 and 4, the elastic contact elements 2 and the seat elements 4 extend through the interior of the wholly integral insulating block 6, and the insulating sheets 7 are interposed between the adjacent elastic contact elements 2 extending through the interior of this block 6 in order to isolate the adjacent elastic contact elements 2, preferably the elastic contact elements 2 and the seat elements 4. As a result, the spacing between the adjacent electric contactors 1 in the block 6 is maintained, and the contact portion 2a of each elastic contact element 2 is slightly projected upward from the upper surface of the front end portion of the insulating block 6 so as to be exposed. The terminal 3 is extended downward from the lower surface of the insulating block 6 so as to be exposed, while both or either of the front end 4a and rear end 4b of the seat element 4 can be exposed from the front and rear surfaces of the insulating block 6.

More specifically, three or more end portions including the contact portion 2a of each elastic contact element 2 are exposed. The group of electric contactors 1 in the insulating block 6 are formed by charging a synthetic resin as an insulating material around contactors 1 placed within a mold. At this time, the end portions, for example, contact portions 2 and other end portions 4a, 4b can function as means for fixing each electric contactor 1 within the mold. Accordingly, the existing positions of the electric contactors 1 can be secured by three point mountings, so that they are not rotated nor shifted by resin charging pressure. As a consequence, the electric contactor unit according to the present invention can be molded properly.

However, the present invention does not exclude the case where the end portions 4a, 4b of the seat element 4 are embedded in the insulating block 6. Also, the terminal 3 may be disposed along the surface of the insulating block 6 or it may be disposed within a hole or groove formed in the surface of the insulating block 6.

Examples of the insulating sheet include a synthetic resin film, and a ceramic foil. As a means for interposing between the electric contactors, insulating sheets 7 which are cut into separate leaves are interposed between the adjacent electric contactors 1 respectively in the arrangement of FIG. 4, and insulating sheets 7 which are mutually connected at one ends by a connection element 7a are interposed between the adjacent electric contactors 1 respectively in the arrangement of FIG. 7.

Figure 8:
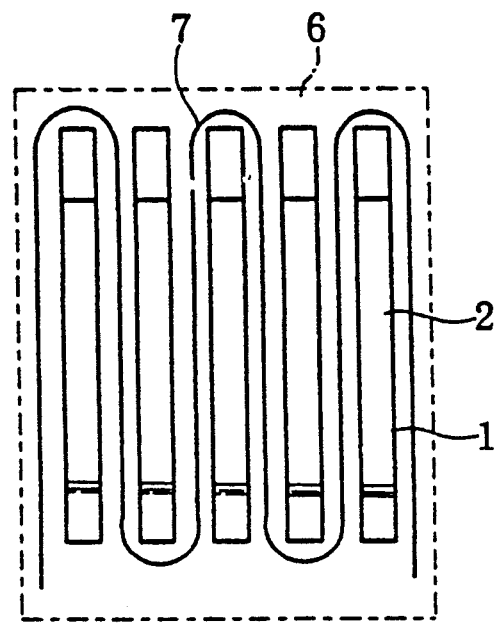
FIG. 8 is a schematic plan view of an electric contactor unit with further modified insulating sheets interposed between the adjacent electric contactors.
Figure 9:
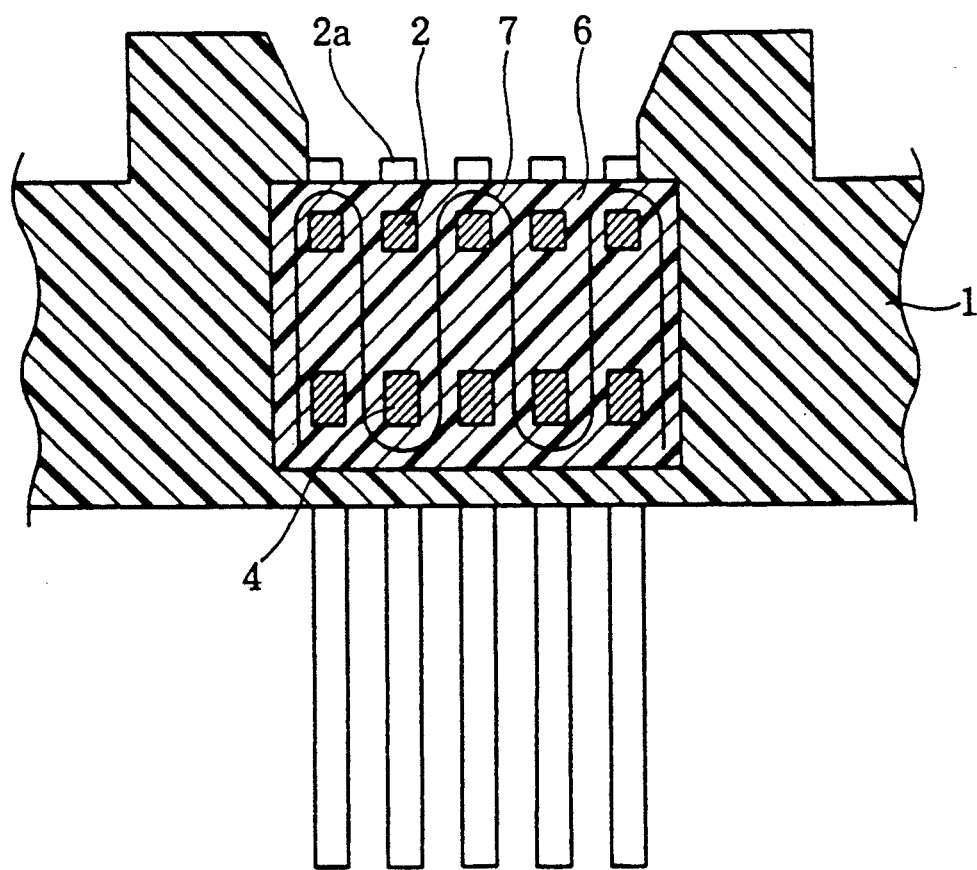
FIG. 9 is a vertical sectional rear elevation view similar to FIG. 6 of the electric contactor unit with the further modified insulating sheets interposed between the adjacent electric contactors, and mounted on a connector base.

In the examples shown in FIGS. 8 and 9, a single-leaf continuous insulating sheet 7 is laid in a sinusoidal fashion and interposed between the adjacent electric contactors 1. In FIG. 8, the insulating sheet 7 is laid in a zigzag fashion in a lateral direction, and in FIG. 9, the insulating sheet 7 is laid in a zigzag fashion in a vertical direction, both in order to be interposed between the adjacent electric contactors 1 so that the elastic contact elements 2 and seat elements 4 can be isolated from the adjacent electric contactors.

For interposing, the insulating sheet 7 is engaged with the adjacent opposing surfaces of the electric contactors 1, or otherwise, the insulating sheet 7 is simply interposed between the adjacent electric contactors 7 in order to form the block.

As shown in FIG. 3, by urging the terminal 5 against the contacting portion 2a after the electric part terminal 5 such as an IC lead is placed on the contact portion 2a exposed from the upper surface of the insulating block 6, the elastic contact element 2 is elastically shifted downward while compressing and flexing the elastic insulating material forming the insulating block 6, and a contact pressure with the electric part terminal 5 can be obtained by the reaction of the elastic contact element 2 and elastic insulating material.

Figure 5:
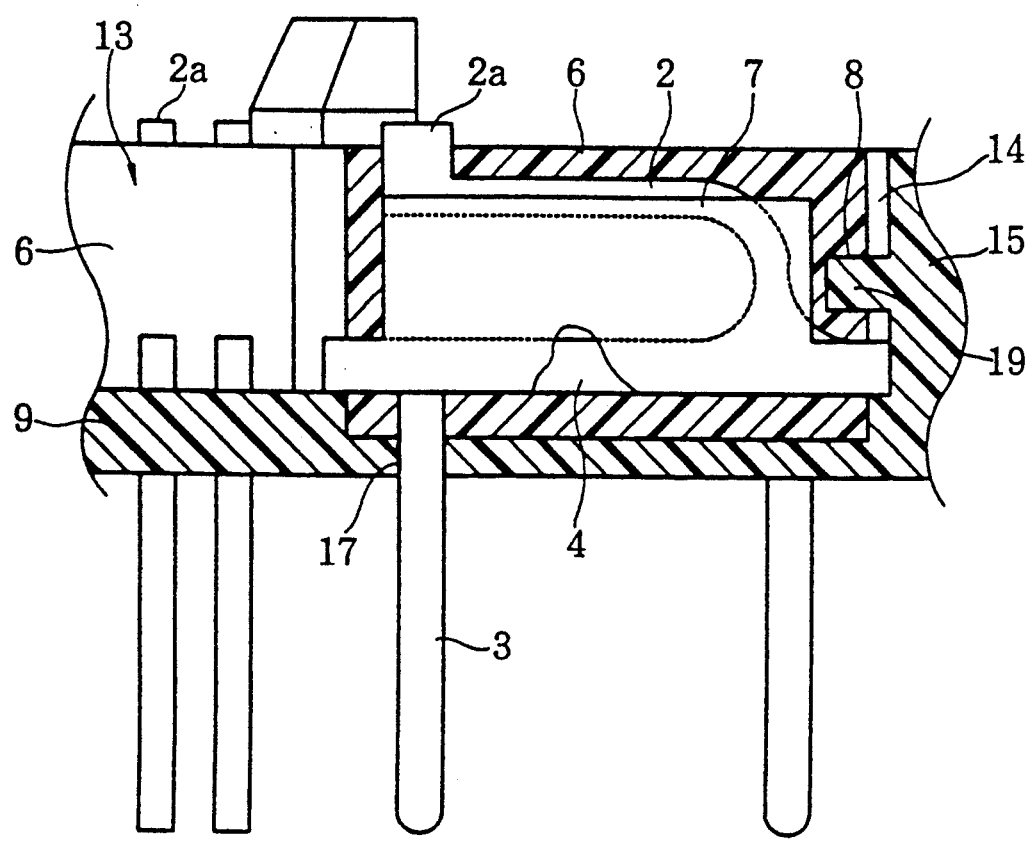
FIG. 5 is a sectional elevation view showing the above electric contactor unit mounted on a connector base.
Figure 6:
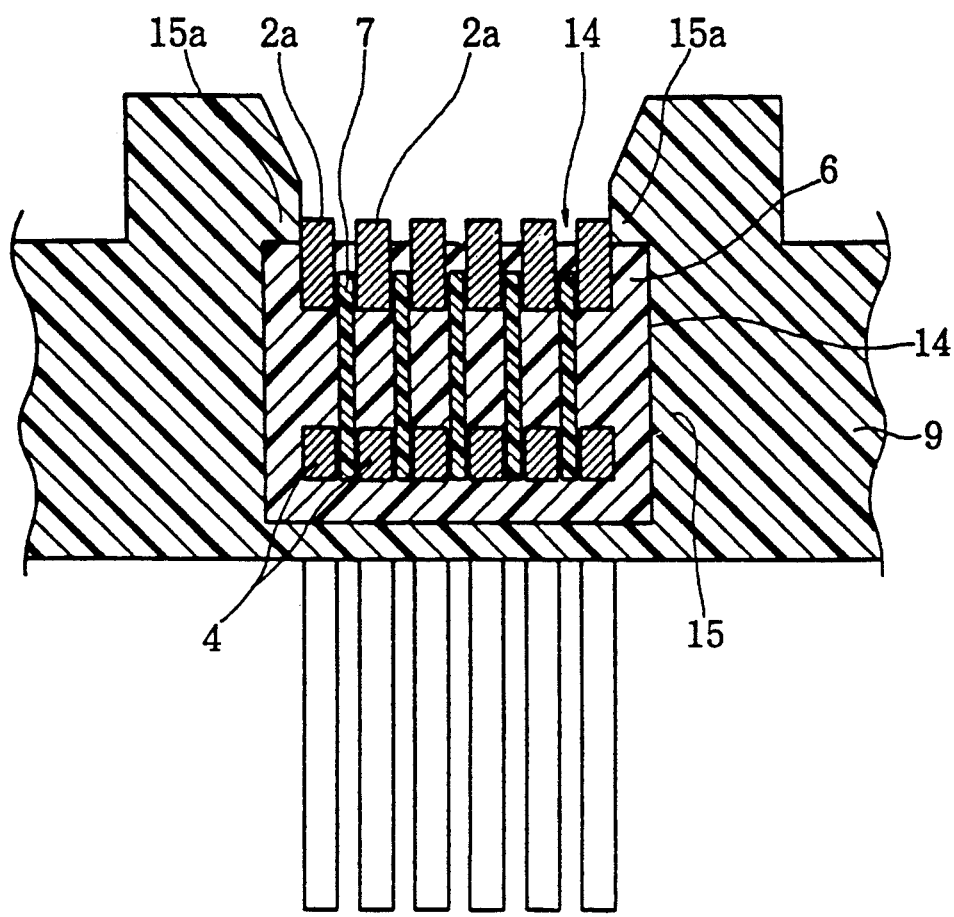
FIG. 6 is a transverse sectional view of taken along line 6—6 of FIG. 5.
Figure 7:
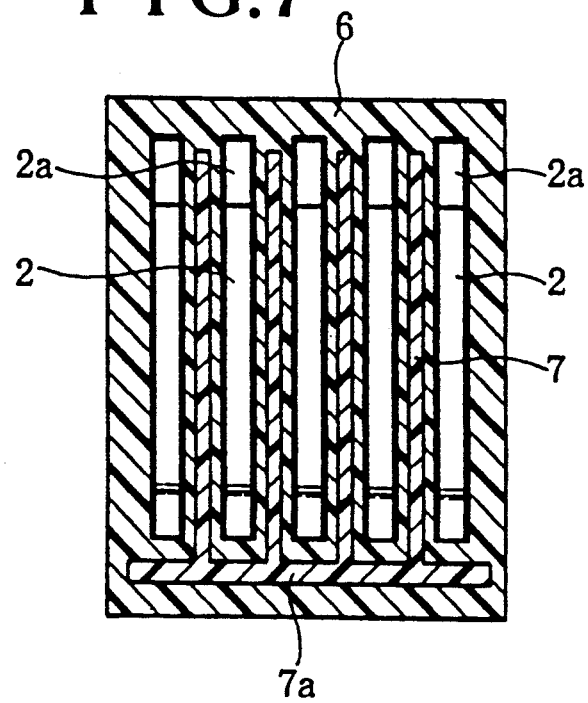
FIG. 7 is a horizontal sectional view of an electric contactor unit with modified insulating sheets interposed between the adjacent electric contactors.

The insulating block 6 functions as a carrier for the electric contactors 1 as well as a means for supplementing the pressure contact. The insulating block 6 can also function as a means for mounting the electric contactor unit onto a predetermined position of the connector base 9. As an additional construction for mounting the contactor unit onto the connector base 9, a recess 8 or knob may be formed in a rear surface and a side surface of the insulating block 6. As shown in FIGS. 5 and 6, the electric contactor unit is mounted on the connector base 9 by means of the insulating block 6. The connector base 9 is provided at a central portion thereof with a mounting space 13. A mounting space 14 for receiving the insulating block 6 is formed at a peripheral area of the mounting space 13. The insulating block 6 is received in the mounting space 14, and the side surfaces or front and rear surfaces or upper surface of the insulating block 6 is regulated by a regulation wall 15 defining the mounting space 14 in order to correctly position the insulating block 6. At this time, the recesses 8 or knobs formed on the side surface or rear end face, etc. are engaged with corresponding knobs or recesses formed on the regulation wall 15, thereby serving as a means for retaining the insulating block 6 in the mounting space 14. In the example shown in FIG. 5, a knob 19 is formed on the regulation wall 15 defining the mounting space 14 for receiving the insulating block 6, and the knob 19 is brought into engagement with the recess 8 in order to mount the insulating block 6 in the mounting space 14.

The insulating block 6 can be firmly secured to the inner surface of the mounting space 14 by adhesive in addition to the provision of the recess 8 and a knob. As another means, the insulating block 6 may be mounted in the mounting space 14 by tightly pushing the corner portions and edge portions thereof into the mounting space 14 without using adhesive. In the example shown in FIG. 6, the corner portions and edge portions of the insulating block 6 are pressed by a retainer portion 15a formed on the regulation wall 15 in order to hold the insulating block 6 in the mounting space 14.

When the electric contactor unit is received in the mounting space 14 of the connector base 9, each terminal 3 is inserted into a corresponding hole 17 formed in the bottom of the mounting space 14 and projected downward from the connector base 9. In the electric contactor unit, by inserting and fixing the insulating block 6 in the mounting space 14, the press-fitting of the terminal 3 into the hole 17 can be eliminated. Therefore, the terminal 3 can be held by the connector base 9 without forming a press-fit claw on the terminal 3. By eliminating the press-fit claw as in the prior art, the height of the electric contactor can be reduced. Also, an inductance component between the contact portion 2a and the terminal 3 can be reduced.

In the above embodiments, although a plurality of electric contactor units are formed and they are mounted in predetermined positions on the connector base 9, these unit insulating blocks can be integrated. In other words, the groups of electric contactors 1 arranged on two or four sides of the mounting space 13 for the electric part can be integrally formed in a common insulating block 6. This insulating block 6 is provided at a central portion thereof with an air flowing opening corresponding to the opening formed in the mounting space 13, and electric contactor holding block portions of the insulating block 6 are integrally arranged on two or four sides about the opening formed in the central portion of the insulating block 6.

Although not shown, an upper surface and a basal portion of the elastic contact element 2, or a lower surface of the seat element 4 may be exposed from the insulating block 6. That is, there are cases where the electric contactor 1 is covered at a required part thereof with the insulating block 6, and the remaining part is left exposed.

The present invention includes a case where a plurality of insulating blocks 6 are formed in the long direction of the elastic contact element 2.

As described in the foregoing, according to the present invention, the insulating sheets are interposed between the adjacent electric contactors and in that state, they are integrally formed into a block of an insulating material. Owing to the foregoing arrangement, the present invention can effectively cope with the requirement for mounting the electric contactors at very small pitches, and a sideways motion of the electric connector caused by resin charging pressure can be prevented at the time when the insulating block is formed. Even if the injection molding pressure is applied to the electric contactors, the electric contactors can be positively prevented from being short-circuited with each other. Moreover, a possible short-circuit when the electric contactors contact a foreign matter such as a metal screw can be prevented effectively.

Furthermore, the electric contactor unit can be easily assembled onto the connector base utilizing the insulating block, and much time and labor can be saved.

Moreover, by fixing the electric contactors to a resin shaping mold and injection-molding the same with an insulating material, the insulating block can be easily formed into a shape required.

Furthermore, metal plating at the portion covered with the insulating block can be eliminated. By virtue of the arrangement that three or more end portions including the contact end portion of the electric contactor can be fixed to a mold, an existing plane for each electric contactor is fixed within the mold, and the small pitches of the electric contactors can be obtained.

What is claimed is:

1. An electric contactor unit comprising:
   a plurality of side-by-side electric contactors each having at least one resilient contact portion for being contacted by a terminal of an electric part and resiliently moved, and each having a terminal portion;
   insulating sheets coextensive with and interposed between adjacent ones of said electric contactors and with which said contactors are engaged; and
   a hollow block of an elastic insulating material molded around said contactors and including said at least one resilient contact portion and said terminal portion and peripheral edges of said sheets in intimate engagement therewith for embedding said contactors and said sheets within said insulating material with said at least one contact portion and said terminal portion of each contactor exposed outwardly from said block through said insulating material, said insulating material being sufficiently elastic for permitting said at least one contact portion to be resiliently moved against the resiliency of said insulating material when a terminal of an electric part is urged against said at least one contact portion.

2. An electric contactor unit as claimed in claim 1 in which at least one further portion of each electric contactor is exposed from said block of insulating material.

3. An electric contactor unit as claimed in claim 1 in which said insulating sheets are joined to each other at corresponding ends of said insulating sheets.

4. An electric contactor unit as claimed in claim 1 in which said insulating sheets are joined to each other in a single sinusoidal insulating sheet member.

* * * * *